United States Patent
Talanov et al.

(10) Patent No.: US 7,362,108 B2
(45) Date of Patent: *Apr. 22, 2008

(54) METHOD AND SYSTEM FOR MEASUREMENT OF SIDEWALL DAMAGE IN ETCHED DIELECTRIC STRUCTURES USING A NEAR FIELD MICROWAVE PROBE

(75) Inventors: Vladimir V. Talanov, Ellicott City, MD (US); Andrew R. Schwartz, Bethesda, MD (US); Andre Scherz, Baltimore, MD (US)

(73) Assignee: Solid State Measurements, Inc., Pittsburgh, PA (US)

( * ) Notice: Subject to any disclaimer, the term of this patent is extended or adjusted under 35 U.S.C. 154(b) by 216 days.

This patent is subject to a terminal disclaimer.

(21) Appl. No.: 11/249,705

(22) Filed: Oct. 14, 2005

(65) Prior Publication Data

US 2006/0087305 A1   Apr. 27, 2006

Related U.S. Application Data

(60) Provisional application No. 60/618,574, filed on Oct. 15, 2004.

(51) Int. Cl.
*G01R 27/04* (2006.01)
*G01R 35/00* (2006.01)
*G01R 27/26* (2006.01)
*G01R 31/26* (2006.01)

(52) U.S. Cl. .................. 324/636; 324/601; 324/662; 324/765

(58) Field of Classification Search ............. 324/636, 324/601, 765, 662; 977/862
See application file for complete search history.

(56) References Cited

U.S. PATENT DOCUMENTS

| | | | | |
|---|---|---|---|---|
| 6,496,018 B1 * | 12/2002 | Nagata et al. | ............... | 324/636 |
| 6,532,806 B1 * | 3/2003 | Xiang et al. | ................. | 73/105 |
| 6,600,333 B1 * | 7/2003 | Martin et al. | ............... | 324/765 |
| 2004/0059715 A1 * | 3/2004 | Lin et al. | .................. | 707/1 |
| 2006/0288782 A1 * | 12/2006 | Sawamoto et al. | ........... | 73/579 |

OTHER PUBLICATIONS

F. Iacopi, et al., Electrochem. and Solid-State Lett. 7 (4), G79 (2004).
F. Iacopi, et al., Mat. Res. Soc. Symp. Proc. vol. 812, F1.5.1 (2004).

(Continued)

*Primary Examiner*—Andrew H. Hirshfeld
*Assistant Examiner*—Jeff Natalini
(74) *Attorney, Agent, or Firm*—The Webb Law Firm

(57) ABSTRACT

By using techniques for near field probes to measure dielectric values of blanket films, the measure of the sidewall damage of the patterned structure is calculated. The interaction between the near field probe and the etched structure is modeled to obtain the model total capacitance. The near field microwave probe is calibrated on a set of blanket films with different thicknesses, and the dielectric constant of the etched trench structure is calculated using the measured frequency shift and calibration parameters. The measured capacitance is further calculated for the etched trench structure using the dielectric constant and the total thickness of the etched trench structure. The effective dielectric constant of the structure under study is extracted where the model capacitance is equal to the measured capacitance. The measure of the sidewall damage is further calculated using the effective dielectric constant.

20 Claims, 7 Drawing Sheets

OTHER PUBLICATIONS

F. Iacopi, et al., Proc. IEEE 2005 International Interconnect Tech. Conf., Piscataway, NJ, USA: IEEE, 217-19 (2005).

M. Shimada, et al., Proc. IEEE 2005 International Interconnect Tech. Conf., Piscataway, NJ, USA: IEEE, 88-90 (2005).

H. Struyf, et al., Proc. IEEE 2005 International Interconnect Tech. Conf., Piscataway, NJ, USA: IEEE, 30-32 (2005).

S. Satyanarayana, et al., Semiconductor International 28 (6), 63 (2005).

* cited by examiner

METHOD AND SYSTEM FOR MEASUREMENT OF SIDEWALL DAMAGE IN ETCHED DIELECTRIC STRUCTURES USING A NEAR FIELD MICROWAVE PROBE

REFERENCE TO RELATED APPLICATIONS

This Utility Patent Application is based on Provisional Patent Application Ser. No. 60/618,574, filed 15 Oct. 2004.

FIELD OF THE INVENTION

The present invention relates to measurement techniques. In particular, this invention directs itself to a technique for measurement of dielectric constants of etched thin films using near field microwave probes.

More in particular, the present invention is directed to non-contact, non-destructive, and non-invasive measurements employing a balanced two conductor near field microwave probe to measure the extent of dielectric sidewall damage caused by the dielectric etching process used in integrated circuits fabrication.

The present invention is also directed to a technique for measurements of patterned dielectric structures using quantitative dielectric constant measurements on low-k blanket films.

BACKGROUND OF THE INVENTION

In manufacturing of integrated circuits, the Damascene process is a common fabrication process for forming copper wires in integrated circuits. As presented in FIGS. 1A-1C, the Damascene process involves the following steps:
1. Deposition of a dielectric film 10 of a desired thickness $t_{film}$ on a substrate 12 (FIG. 1A);
2. Formation of a mask 14 on the surface of the film 10 by photolithography (FIG. 1B);
3. Etching away of dielectric material of the film 10 through the mask 14 to produce the desired pattern, e.g., trenches 16 in the film 10 (FIG. 1C); and
4. Filling of the etched trenches 16 with copper to produce wires, insulated from each other by the dielectric material that remains after etching.

Rapid advancements are projected over the next decade relating to the use of new materials in the interconnects, e.g., from aluminum to copper to reduce the resistance of the metal wires, and from $SiO_2$ to dielectrics with a lower dielectric constant k, commonly known as "low-k" materials. This change will reduce delay times on interconnect wires and minimize crosstalk between wires. Low-k dielectric materials are the materials whose dielectric constant is lower than that of silicon dioxide, which has a dielectric constant k=4. Disadvantageously, low k materials are susceptible to damage during the etching step of the Damascene process. This damage occurs primarily along sidewalls 20 of the etched trenches 16. The effect of sidewall damage is represented by an increase of the dielectric constant of the material along the sidewalls 20, which may degrade the overall performance of the manufactured integrated circuit.

As shown in FIG. 1C, the effect of the dielectric sidewall damage for the trenches 16 of the width W separated by the low-k dielectric material 22 of width S is presented as damaged portions $t_d$ of the sidewalls 20 having the dielectric constant k+Δk, wherein the k is a dielectric constant of the undamaged film 10, while the Δk is a change of the dielectric constant due to the dielectric etching process.

Measurement of the extent of sidewall damage after etch is difficult, and once the film has been etched, conventional processes for performing dielectric constant measurements are not feasible.

It is therefore desirable to provide an accurate and precise measurement approach to acquire a measure of the extent of dielectric sidewall damage after etch of the dielectric structure.

SUMMARY OF THE INVENTION

It is therefore an object of the present invention to provide a dielectric constant measurement technique using near field microwave probes for detection and quantification of sidewall damage after etch.

It is another object of the present invention to provide a technique for quantitative measurement of an effective dielectric constant $k_{eff}$ value of the patterned structure using measurement techniques for blanket films, even though the $k_{eff}$ of the etched patterned structure is affected by the geometry of the patterned structure as well as sidewall damage.

It is also an object of the present invention to provide a novel non-destructive, non-invasive technique based on the use of microwave near field scanning probe for non-contact measurements of the dielectric constant of the patterned structure etched in low-k films to obtain a characterization of the extent of the dielectric sidewall damage caused by etching.

The present invention represents a method of measurement of sidewall damage in etched dielectric structures using a near field microwave probe. The method includes the steps of:
- positioning the tip of a near-field microwave probe (NMP) a predetermined tip-sample separation distance over the surface of the sample under study which includes a plurality of trenches etched in a low-k film of a thickness $t_{film}$;
- measuring the dielectric constant $k_{means}$ of the sample under study by the NMP;
- determining geometries of the sample under study, including thickness of various layers, widths/depths of trenches, space between trenches, angle of trench sidewall, etc.;
- calculating a capacitance $C_{meas}$ of the sample under study based on the dielectric constant $k_{meas}$ and the geometries of the sample under study;
- modeling a total capacitance $C_{model}$ of the sample under study in accordance with a predetermined model (which may be an analytical model based on lumped element capacitors; or a numerical finite element model, e.g., Maxwell™ technique; or a numerical finite difference model, e.g., Raphael™ technique);
- finding a dielectric constant $k_{eff}$ at which the $C_{model}$ substantially equals the $C_{meas}$, wherein $k_{eff}$ is an effective dielectric constant of the low-k film constituting a sidewall of the trenches (the $k_{eff}$ is affected by the geometry of the sample under study and by the sidewall damage thereof); and
- extracting a measure of the sidewall damage Δk·$t_d$, using the dielectric constant k of the undamaged low-k film, spacing S between the trenches etched in the low-k film, width W of the trenches, and $k_{eff}$ found in the previous step.

The present invention also pertains to a system for measurements of sidewall damage in a sample which includes a plurality of trenches etched in a low-k film formed on a substrate. The system includes:
- a near-field microwave probe having a tip forming a resonator structure,
- a calibration unit for calibrating the near-field microwave probe for a plurality of blanket films of different thicknesses,
- a measurement unit measuring resonance frequency shift of the near-field microwave probe for the sample under study,
- a geometry unit determining geometry parameters of the sample under study,
- a model unit modeling a total capacitance $C_{model}$ of the sample under study, and
- a processor unit coupled to the measurement unit, geometry unit, and the model unit to calculate in sequence:
  - (a) the dielectric constant $k_{meas}$ of the sample under study using the measured resonant frequency shift obtained from the measurement unit, as well as using calibration data obtained from the calibration unit,
  - (b) the measured capacitance $C_{meas}$ of the sample under study using the dielectric constant $k_{meas}$ and the geometric parameters of the sample under study;
  - (c) the dielectric constant $k_{eff}$ at which the total capacitance $C_{model}$ equals to the measured capacitance $C_{meas}$, and
  - (d) the measure of the sidewall damage $\Delta k \cdot t_d$ using the dielectric constant $k_{eff}$ and the geometric parameters.

DESCRIPTION OF THE PREFERRED EMBODIMENT

Figure 1A:
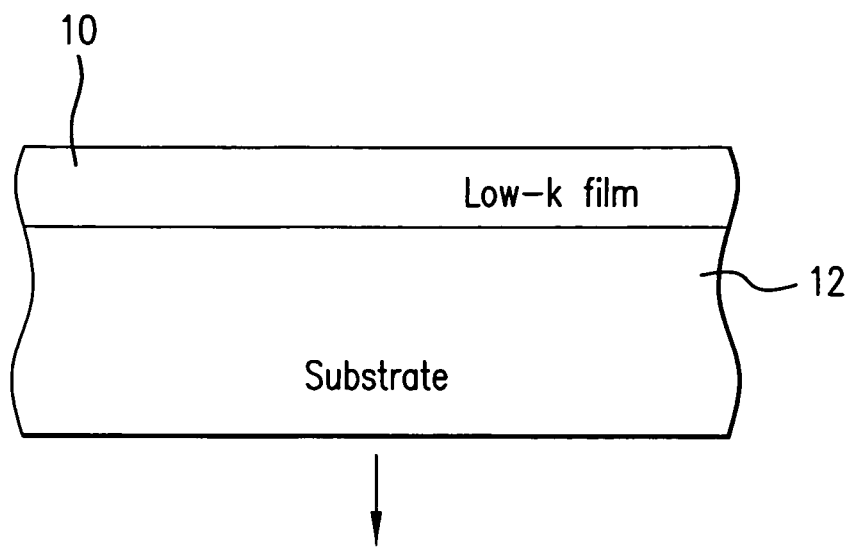
FIGS. 1A-1C are schematic representations of the Damascene process for forming copper wires in integrated circuits.
Figure 1B:
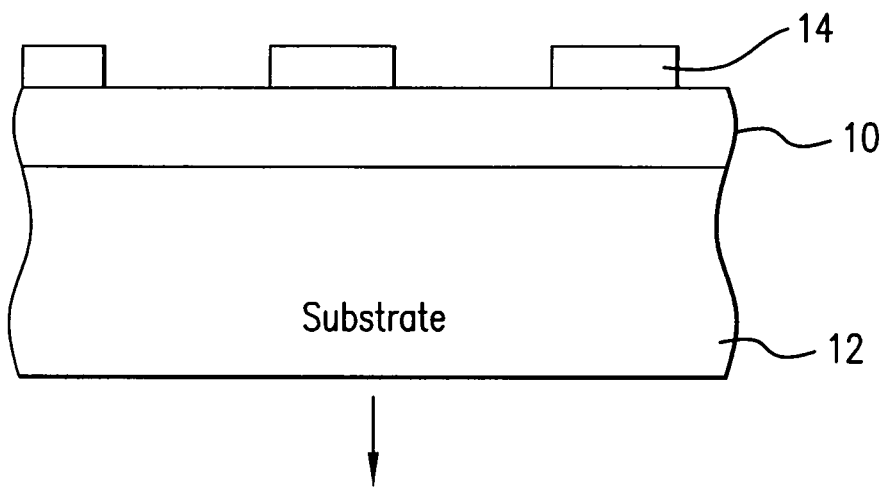
Figure 1C:
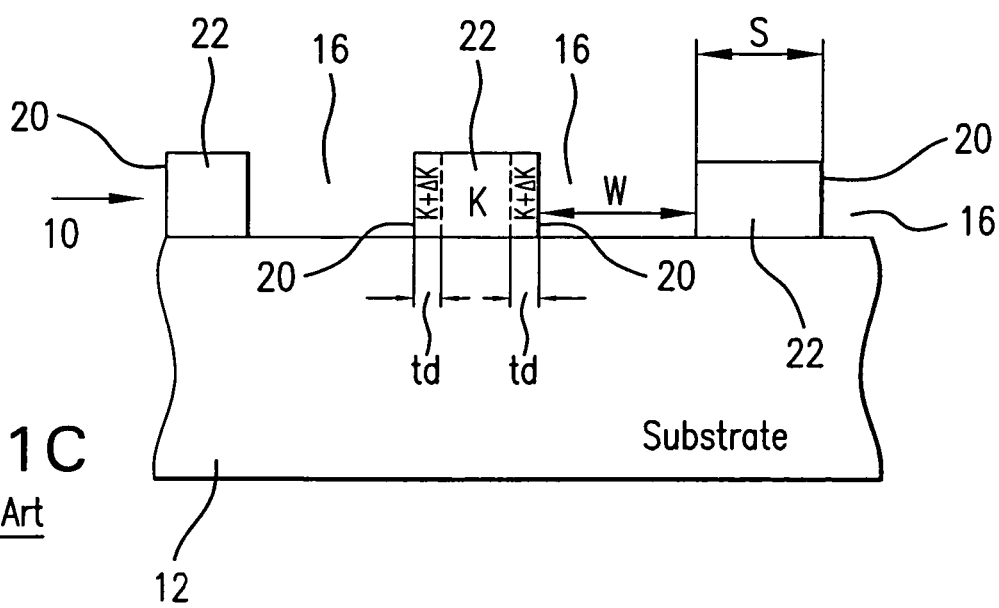
Figure 2A:
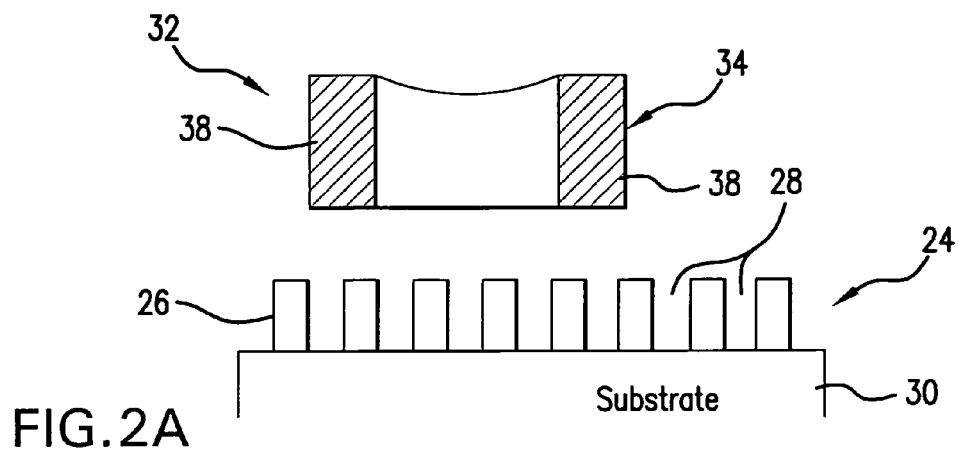
FIG. 2A is a schematic representation of the near field microwave probe positioned above the patterned structure under test.
Figure 2B:
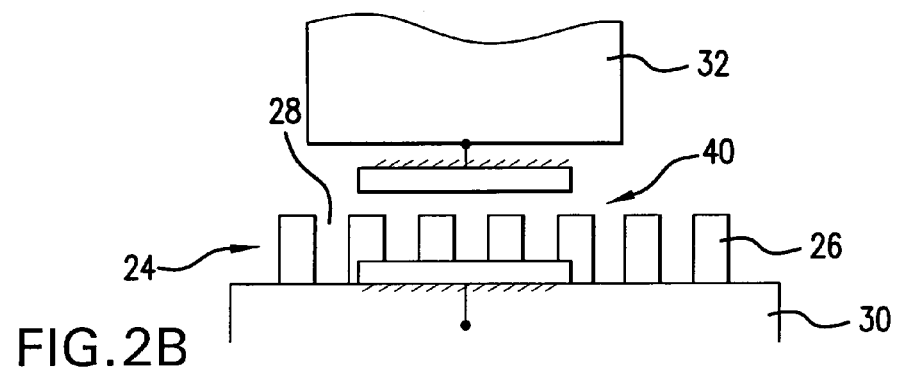
FIG. 2B shows schematically a model of a parallel plate capacitor formed by each of the electrodes of the field microwave probe with the structure under test.
Figure 2C:
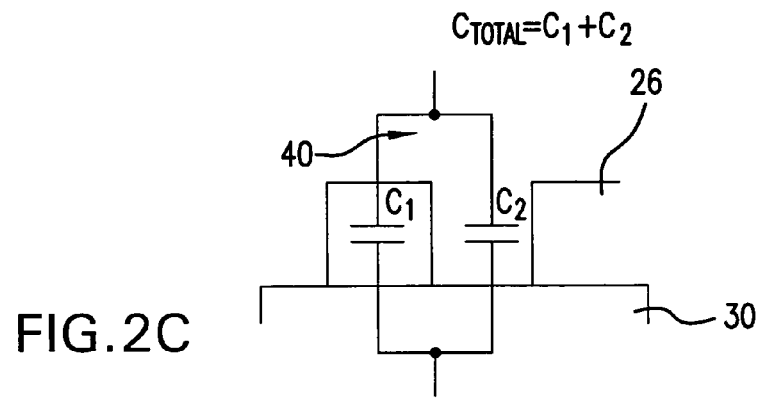
FIG. 2C is a model of a capacitance scheme for a single pitch of the structure under test.
Figures 2D, 2E:
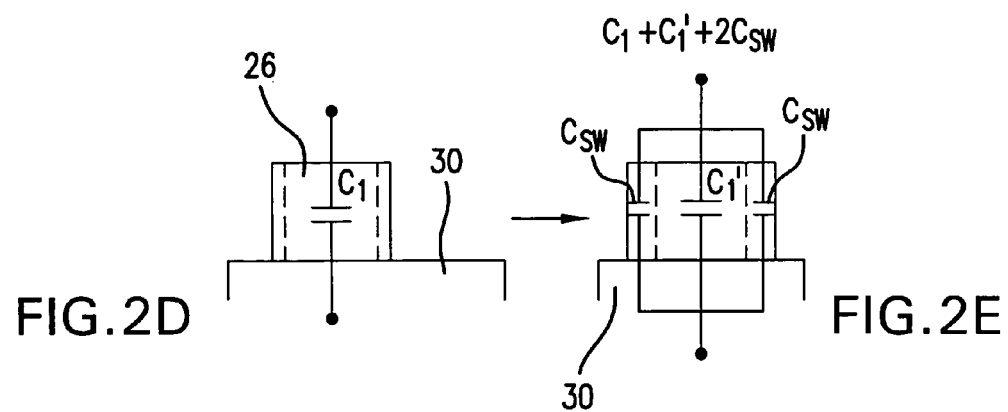
FIGS. 2D and 2E are models of capacitance schemes presenting the effect of sidewall damage.

Referring to FIGS. 2A-2E, the structure (also referred to herein as a sample) under test 24 includes a low-k film 26 patterned by the Damascene process, shown in FIGS. 1A-1C, to form a plurality of trenches 28 which are parallel etched trenches formed on a substrate 30. A near field probe 32, to be discussed in further detail in following paragraphs, includes a tip 34 formed of a dielectric 36 with two metal electrodes 38 preferably formed of Al. In general, the dimensions of the probe 32 are much larger than the thickness $t_{film}$ of the dielectric film 26 and the pitch of the etched sample under test 24. Therefore, each of the electrodes 38 of the probe 32 forms a parallel plate capacitor 40 with the substrate 30 under the film 26. In order to analyze the structure presented in FIG. 2B, the equivalent scheme (or a model) involving a single pitch of the sample under test 24 is presented in FIG. 2C, where $$C\text{ total}=C_1+C_2 \qquad (1)$$

wherein $C_1$ includes the effect of the sidewall damage, as shown in FIGS. 2D and 2E, and $C_2$ is the model of the capacitance of the trench 28 between the probe 32 and the substrate 30.

The effect of the sidewall damage is presented more in detail by the equivalent scheme shown in FIG. 2E, wherein $C_1=C_1'+2C_{SW}$, where $C_1'$ is the specific capacitance per unit length for the undamaged portion of the difference between the trenches 28, and $C_{SW}$ is a specific capacitance per unit length along the trenches 28 representing the damaged sidewalls 20 of the trenches 28, also shown in FIG. 1C.

The equation (2) may be rewritten, taking into consideration the parameters presented in FIG. 1C, as:

$$C_1 = \frac{k(S-2t_d)}{t_{film}} + 2\frac{(k+\Delta k)t_d}{t_{film}} \qquad (3)$$

This equation (3) can be presented further as:

$$C_1 = \frac{k \cdot S + 2\Delta k \cdot t_d}{t_{film}} \qquad (4)$$

Thus, equation (1) may be rewritten in the following form:

$$C_{TOTAL} = C_1 + C_2 = \frac{k \cdot S + 2\Delta k \cdot t_d}{t_{film}} + \frac{W}{t_{film}} \qquad (5)$$

where W is the width of the etched trench, S is the spacing between the trenches, $t_{film}$ is the thickness of the film, k is the dielectric constant of the undamaged film, $\Delta k$ is the change of dielectric constant in the damaged sidewall, $t_d$ is the width of the damaged sidewall portion.

Further, $C_{TOTAL}$ may be presented as:

$$C_{TOTAL} = \frac{k_{meas} \cdot (S+W)}{t_{film}} \qquad (6)$$

wherein $k_{meas}$ is the measured dielectric constant for the etched sample under study 24.

Assuming, that the geometry of the etched sample under test 24 (S, W, $t_{film}$) and undamaged dielectric constant k are known, then it is possible to extract the product $\Delta k \cdot t_d$ from the preferred dielectric constant $k_{meas}$:

$$\Delta k \cdot t_d = \frac{1}{2}[k_{meas}(S+W) - k \cdot S - W] \quad (7)$$

$\Delta k \cdot t_d$ is a measure of the extent of the sidewall damage for the structures of the sample under test 24.

The system and the method of the present invention which will be described in detail further herein are designed based on the technique presented in FIGS. 2A-2E.

Figure 3:
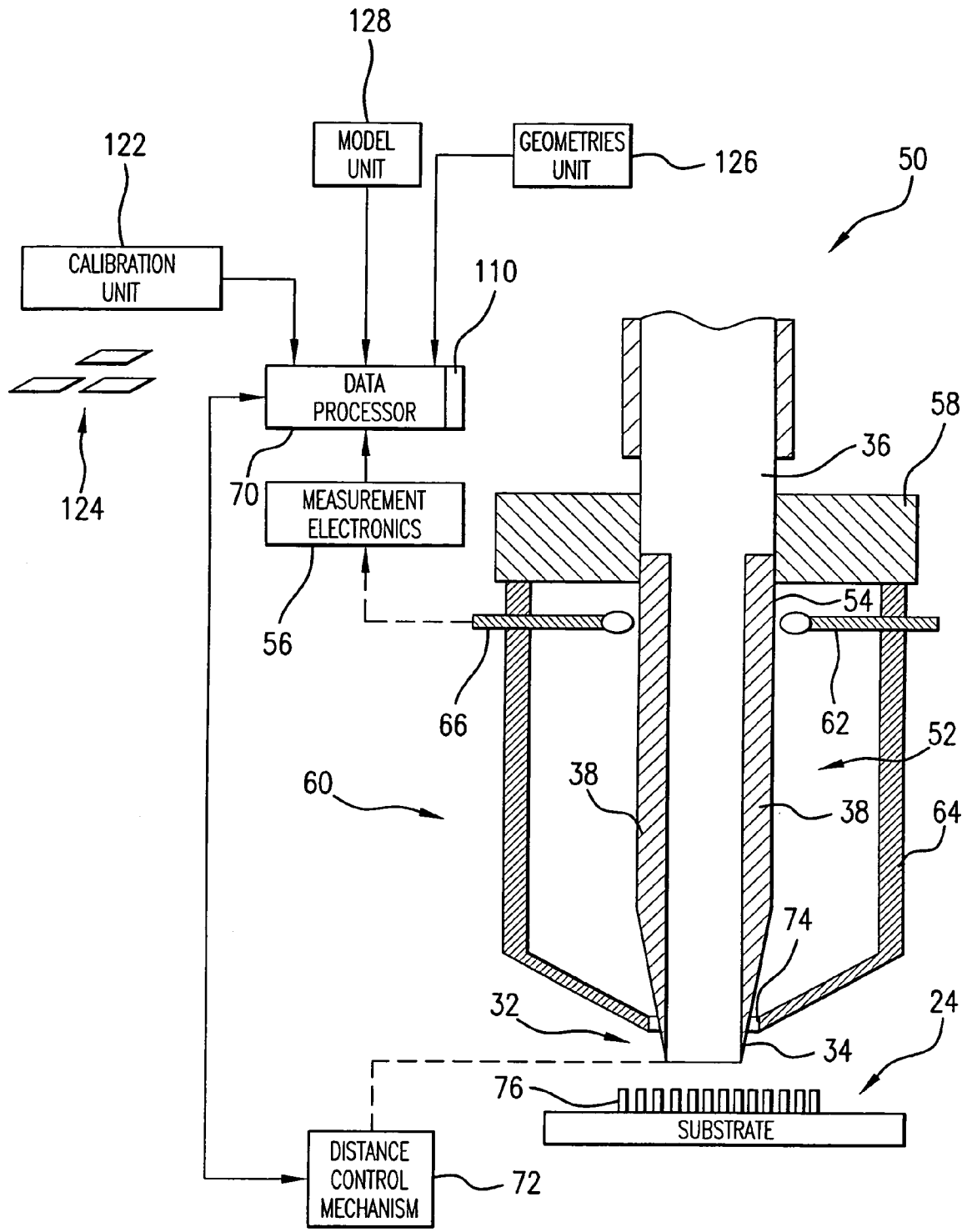
FIG. 3 is a schematic representation of the system of the present invention on the near field scanning microwave probe for measurement of the sidewall damage in the etched dielectric structure under test.
Figure 4:
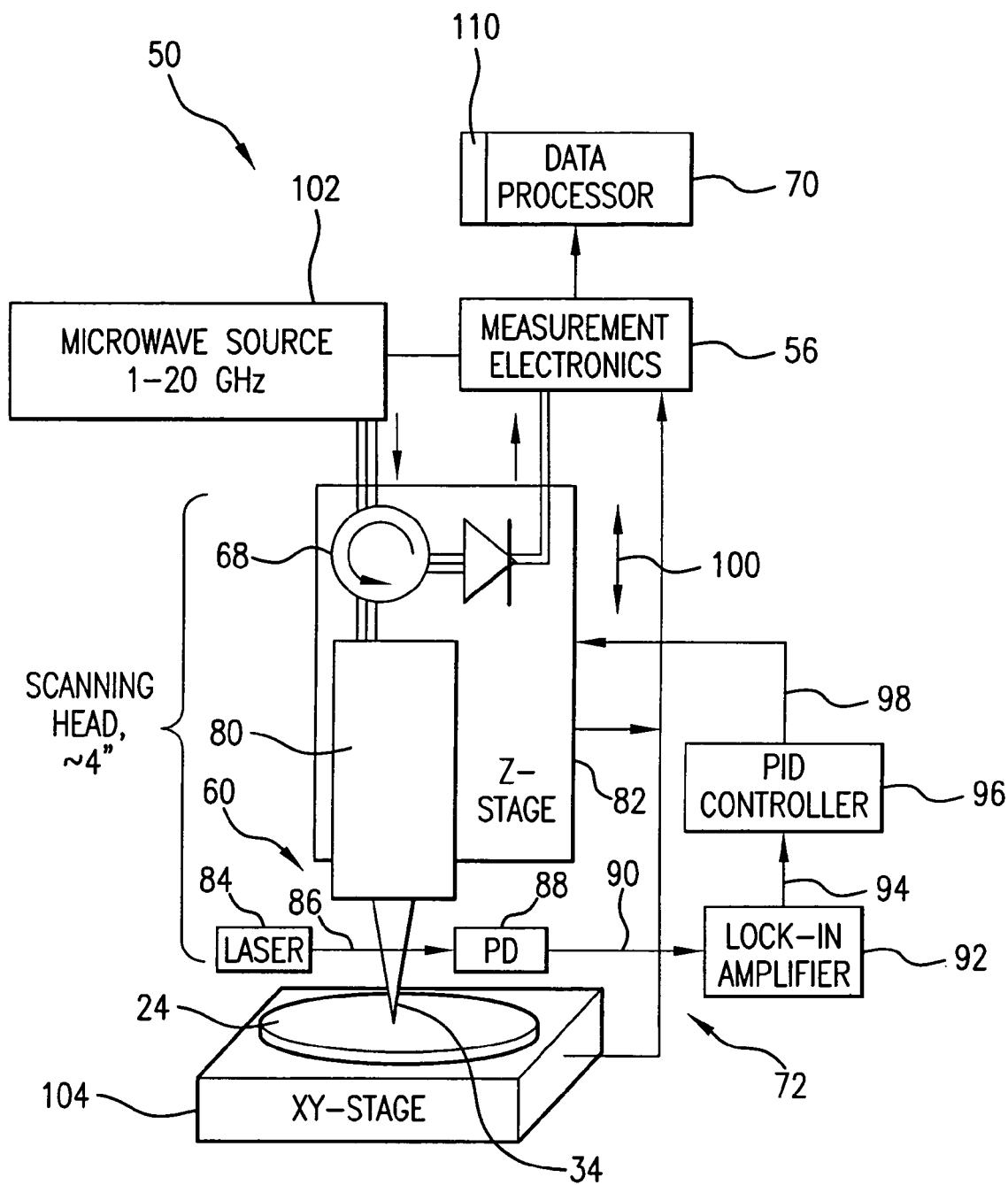
FIG. 4 is a schematic representation of the experimental set-up of the measurement system of the present invention.

Referring to FIGS. 3 and 4, a system 50 for non-destructive determination of the measure of the sidewall damage in the etched sample 24 is based on a balanced two conductor transmission line 52 which includes two spatially separated symmetrically arranged electrical conductors (electrodes) 38 of circular, semi-circular, rectangular, or similar cross-sectioned contour. The conductors 38 may be formed from copper, tungsten STM tips, gold, silver, or aluminum strips deposited onto a dielectric support as will be detailed in following paragraphs. A probing end 32 of the transmission line 50 is brought in close proximity to the sample under study 24 and an opposite end 54 of the transmission line 50 is either connected to measurement electronics 56 for the determination of a reflected signal's phase and magnitude, or to a terminating plate 58 to form a resonator structure 60 for the purposes described in the following paragraphs.

The probe 50 is primarily envisioned in two embodiments:

A. In operation as a transmission line for feeding a signal to the sample 24 and measuring the phase and magnitude of the reflected signal. This transmission line is operated either in the odd mode, i.e., in a mode in which the current flow in one of the two conductors 38 is opposite in direction to that in the other conductor; or in an even mode if a conducting sheath is used for enveloping the transmission line 52. In this embodiment, the behavior of the transmission line 52 is analogous to the case of symmetrically coupled microstrip lines within an enclosure. When operated in the even mode, the interaction between the sample 24 and the probe 32 is similar to the coaxial symmetries known to those skilled in the art. Measurements of the phase and magnitude of the reflected signal by means of the transmission line arrangement are broadband in frequency but are generally not satisfactory with respect to sensitivity to the sample properties and require additional expensive and complex electronic equipment to be used such as vector network analyzers.

B. In order to obtain a more sensitive and accurate result while employing less expensive equipment, the probe system 50 of the present invention includes the resonator structure 60 which is formed by a portion of the transmission line 52 with the conductors 38 separated by the dielectric medium 36. The dielectric medium 36 may include air, a circulating fluid for temperature stabilization, or high dielectric constant materials for size reduction.

The probing end 32 of the resonator structure 60 is brought into proximity to the sample 24 (which includes low-k films on a wide variety of substrates with trenches etched in the films). The opposite end 54 of the transmission line resonator structure 60 being electrically shorted or opened. The resonator structure 60 is formed in order to measure the resonant frequency and the probe resonant frequency shift of the resonator structure 60 for determination of the dielectric constant (permittivity) of the sample 24.

The spacing between the two conductors 38 and their cross-section must be properly chosen in order to maintain a resonator quality factor Q high enough for accurate measurements of the sample induced changes in the resonant frequency and the Q factor. As an example, the spacing between the conductors 38 may be on the order of, or greater than 1 mm for Q>1000 at 10 GHz.

When the probe is operated as the resonator, the odd and even modes of operation in general result in two different resonant frequencies due to dispersion of the signal and may therefore be separated in the frequency domain in a powered mode and may be monitored independently. The dielectric medium 36 sandwiched between the conductors 38 serves to enhance such dispersion.

The coupling to the resonator 60 is accomplished by a coupling loop 62 positioned close to the resonator 60 and internal to an optional conducting sheath 64. A second coupling loop 66 may be used for the measurement electronics 56 schematically shown in FIGS. 3 and 4. Alternatively, a circulator 68 (or a directional coupler), shown in FIG. 4, may be used to separate the signal reflected from the resonator 60 back to the feed loop 62. The resonant frequency and quality factor Q of the resonator structure 60 may be determined by a Fast Frequency Sweep (FFS) technique or any other standard method for measurement of resonant frequency and Q-factor, such as, for example, Frequency Tracking based on either phase or amplitude detection.

All calculations are carried out by data processor 70 based on predetermined formulas applied to the measured data. The processor 70 additionally controls the overall performance and operation of the measurement electronics 56 as well as a distance control mechanism 72.

The resonator structure 60 forms a $(2n+1)\lambda/4$ or $(n+1)\lambda/2$ resonator (n=0, 1, 2, ...), and its length is determined by the frequency of the lowest mode, e.g., about 25 mm for the $\lambda/2$ mode operating at 4 GHz.

The resonator structure 60 may be enclosed in a cylindrical or other shaped sheath 64 formed of a highly conductive material (such as Cu, Au, Ag, Al). The sheath 64 eliminates both radiation from the resonator 60 and the effect of the probe environment on the resonator characteristics. In particular, the variation influence of moving parts in the proximity of the resonator 60 is eliminated. The sheath 64 has an opening 74 near the sample area that permits efficient coupling of the sample 24 to the resonator 60 and thus permits the resonant frequency and Q factor to be dependent on the sample microwave permittivity (dielectric constant). In situations where the spacing between the conductors 38 is small in comparison to the inner diameter of the sheath, the resonator properties are substantially unaffected by the sheath presence. The upper part of the sheath 64 makes electrical contact with the terminating plate 58. The bottom part of the sheath may have a conical shape in order to provide clear physical and visual access to the sampling area.

As discussed in previous paragraphs, the probing end 32 of the resonator structure 60, specifically tip 34 thereof, is brought into close proximity to the sample 24 for measurement purposes. The geometry of the tip 34, as well as the separation between the tip 34 and the sample 24 present information vital to calibration procedures used for near-field microwave microscopy for quantitative measurements of a material's dielectric constant (permittivity). Since the accurate determination of these parameters is difficult and often impractical, especially for the very small tips of less than, or on the order of a few microns in size of the transmission line 52 shown in FIG. 3, the quantitative measurement of dielectric constant of the material is performed without knowledge of either the actual tip geometry or the absolute tip-to-sample separation by means of employing the independent distance control mechanism 72 which is schematically shown in FIGS. 3 and 4.

In order to perform quantitative measurements with near-field microwave probes, shown in FIGS. 3 and 4, it is important that the separation between the probe tip 34 and the sample 24 be precisely controlled. Without precise control of this distance, changes in sample properties (dielectric constant) cannot be distinguished from changes in distance. To control the distance between the tip 34 and the sample 24, the distance control unit 72 is incorporated into the measurement scheme of the near-field microwave probe system. The distance control unit 72 is coupled bi-directionally to the data processor 70 for data exchange and for control of the distance control mechanism 72.

The distance control measurement 72 of the present invention may be one of many distance control mechanisms known to those skilled in the art, but it is envisioned as a shear-force based distance control mechanism by means of which the tip 34 of the resonant structure 60 is maintained at an unknown, but nominally the same distance from the sample surface 76 during both the calibration procedure and the actual measurement process. Combined with the appropriate theory describing the probe-to-sample interaction in terms of solely the geometry, the distance control mechanism 72 of the present invention has been found to yield accurate quantitative results.

Shear force based distance control mechanism 72 is a distance control mechanism applicable for use in near-field scanning optical microscopy (NSOM). The basic concept of the shear force distance control mechanism is that a probe, specifically the tip 34, is flexible and is mounted onto and dithered by a piezoelectric element or a quartz tuning-fork oscillator (TFO) with an amplitude from a few nanometers down to a few angstroms. As the tip 34 of such a probe is brought into close proximity to the sample surface, the amplitude of the tip oscillations is damped by interactions between the tip 34 and the sample surface. The motion of the tip is detected by an optical beam deflection technique for the piezo element or by a phase- or amplitude-locked loop for the tuning fork oscillator (TFO).

In the measuring technique of the present invention, as shown in FIG. 4, a housing 80 of the microwave probe (resonator) 60 is attached to a dithering piezoelectric element (not shown), which in turn is supported by a fine piezo Z-stage 82. Thus, the tip 34 is dithered by the piezoelectric element with an amplitude ranging from a few nanometers down to a few angstroms.

The motion of the tip 34 is detected by an optical beam deflection unit which includes a laser 84 generating a laser beam 86 directed via the oscillating tip 48 to a photodetector (PD) 88. As the tip 34 is brought into close proximity to the sample surface 24, the amplitude of the tip oscillations is changed, i.e., damped, by interactions between the tip 34 and the sample surface 24 which is detected by the photodetector 88.

Responsive to the change of the amplitude of the tip oscillations, the photodetector 88 generates an output signal 90 indicative of the change in tip-to-sample separation. The signal 90 of the photodetector 86 is supplied to the input of a lock-in amplifier 92, which responsively generates an output control signal 94 indicative of unwanted changes in the separation between the tip 34 and the sample 24.

Another generated signal from an oscillator output of the lock-in amplifier 92 is fed to the dithering element for maintaining the generation of oscillations thereat. The control signal 94 is fed from the output of the lock-in amplifier 92 to a PID (Proportional Integral Derivative) controller 96 which generates in response thereto a control signal 98 which is fed to the fine piezo Z-stage 82 for changing the position thereof along the section shown by the arrow 100 so that the probe attached to the fine piezo Z-stage 82, through the dithering element will adjust its position with respect to the sample 24 in order to reach a predetermined separation between the tip 34 and the sample 24.

The photodetector 88, the lock-in amplifier 92, the PID controller 96, and the fine piezo Z stage 82, in combination with the laser 84 form a feedback loop which maintains the amplitude of the oscillations of the tip 34 fixed at a value less than a predetermined maximum amplitude of oscillations, and thus, permits precise distance control down to approximately 1 nm.

The height of the tip 34 over the samples 24, at which the distance control may be performed is a function of the amplitude of the tip oscillation whereby the smaller the amplitude of oscillations, the smaller the distance attained.

In the apparatus of the present invention, the successful integration of the shear force distance control mechanism 72 with both coaxial probes (on the order of 100 microns) and with dielectric wire-based probes (with apertures down to 1 micron) are attainable with an achieved precision down to 1 nm. Such a precise distance control between the tip 34 and the sample 24 during the measurements of the dielectric constant of the sample 24 is an important part of the measurement process of the present invention since the distance between the tip 34 and the sample 24 is to be maintained at substantially the same distance during the measurement and calibration routines.

The dielectric support member 36 may be made in the form of any of the following embodiments:

a) Optical fiber with exposed cladding, with bare (untapered) cladding diameter in the range of 10 μm to 10 mm. The fiber may be formed from an insulating material that can be tapered by means of etching and/or heating/pulling and has a dielectric loss tangent $\leq 10^{-1}$ at the operating frequency (e.g. quartz, sapphire, glass, etc.)

b) Dielectric rod (substantially circular in cross-section) from approximately 10 μm to 10 mm in outer diameter formed from an insulating material that can be tapered by means of etching and/or heating/pulling and has a dielectric loss tangent $\leq 10^{-1}$ at the operating frequency (e.g. quartz, sapphire, glass, etc.)

c) Dielectric tube (micropipette, etc.) from 10 μm to 10 mm in outer diameter and appropriate inner diameter formed from an insulating material that can be tapered by means of etching and/or heating/pulling, and has a dielectric loss tangent $\leq 10^{-1}$ at the operating frequency (e.g. quartz, sapphire, glass, etc.)

d) Dielectric tube (micropipette, etc.) from 10 μm to 10 mm in outer diameter and appropriate inner diameter formed from an insulating material that can be tapered by means of etching and/or heating/pulling and further has a dielectric loss tangent $\leq 10^{-1}$ at the operating frequency (e.g. quartz, sapphire, glass, etc.) with an optical fiber inserted into the tube.

e) Dielectric bar of square, rectangular, pentagonal, hexagonal, octagonal, or other polygonal contour cross-section with the cross-section linear dimensions from 10 µm to 10 mm formed from an insulating material that can be tapered by means of etching and/or heating/pulling and has a dielectric loss tangent $\leq 10^{-1}$ at the operating frequency (e.g. quartz, sapphire, glass, etc.)

f) Multi-barrel dielectric tubing (with the number of barrels from 2 to 20) or Theta-tube formed from an insulator that can be tapered by means of etching and/or heating/pulling and which has a dielectric loss tangent $\leq 10^{-1}$ at the operating frequency (e.g. quartz, sapphire, glass, etc.) With regard to the multi-barrel dielectric tubing, one or more of the barrels may have an optical fiber or metal wire inserted therein.

To fabricate the near-field microwave probe shown in FIG. 3, a quartz bar with ~1×1 mm² cross-section is tapered down to a sub-micron sizing using a laser-based micropipette puller. Aluminum is deposited onto two opposite sidewalls of the bar and the end of the tapered portion is cut off around 1 µm in size using a focused ion beam (FIB) technique or micropolishing technique which provides a clean tip. The entire structure forms a tapered balanced parallel-plate transmission line shown in FIG. 3 with an open end and no cut-off frequency.

Numerical simulations using Ansoft's High Frequency Structure Simulator (HFSS™), a 3D finite element package, show that the fringe E-field at the end of such a tip forms a "bubble" with diameter on the order of the tip size. The "apertured" approach permits quantitative measurements on a few-micron length scale where the result is insensitive to the material property outside the probing area. The balanced line geometry virtually eliminates the parasitic stray fields and reduces the amount of microwave power radiated from the tip 34 by a few orders of magnitude when compared to unbalanced coaxial probes.

When the probe tip 34 is placed in close proximity to the sample 24 under test, its fringe capacitance $C_t$ is governed by the tip geometry, the sample permittivity, and the tip-sample distance. The complex reflection coefficient from the tip may be determined as follows:

$$\Gamma \cong \exp(-i2\omega Z_0 C_t) \quad (8)$$

where ω is the operating frequency, $Z_0$ is the line characteristic impedance, and $\omega Z_0 C_t \ll 1$. In the experimental set-up shown in FIG. 4, in order to increase the measurement sensitivity the transmission line 52 is formed into a half-lambda resonator 60 which is accomplished by etching the back end of the aluminum strips to the appropriate length. The resonator 60 has a resonant frequency F~4 GHz and an unloaded quality factor Q~100. A conventional magnetic loop is used to couple the microwave signal from a microwave source 102. The resonator 60 is packaged inside the metallic enclosure 64 with the tapered portion protruding externally through the hole 74 in the enclosure wall. The probe resonant frequency F is experimentally determined from the minimum in the probe reflection coefficient $S_{11}$ using a microwave reflectometer with resolution down to 100 Hz.

From Eq. (8) the relative shift in the probe resonant frequency F is found versus change in the tip capacitance $C_t$:

$$\frac{\Delta F}{F} = -\frac{Z_0}{L\sqrt{\varepsilon_0 \mu_0 \varepsilon_{\mathit{eff}}}} \Delta C_t \quad (9)$$

where L is the resonator length, $\epsilon_0$ is vacuum permittivity, $\mu_0$ is vacuum permeability, $\epsilon_{\mathit{eff}}$ is the transmission line effective dielectric constant, and $Z_0$ is the line characteristic impedance. An estimate for the tip capacitance in air is $C_{t0} \sim \epsilon_0 a_t$, where $a_t$ is the tip size; for $a_t \sim 1$ µm, $C_{t0} \sim 10$ aF. For typical probe parameters (L~25 mm, $Z_0$~100 Ω, $\epsilon_{\mathit{eff}}$~2.5) and a 100 Hz precision in ΔF, Eq. (9) yields sensitivity to changes in the tip capacitance on the order of $3 \times 10^{-20}$ F=30 zF.

The probe enclosure and the microwave and the shear-force circuits are installed into a measurement head that is mounted onto a highly accurate piezo-driven z-stage 82. The piezo stage is attached to a mechanical coarse z-stage, which is mounted onto a gantry bridge. A 100-300 mm wafer under test is placed onto a vacuum chuck that is scanned by the 350-mm-travel xy-stage 104. The entire set-up is mounted onto a vibration-isolation platform and placed inside an enclosure to improve acoustic isolation and thermal stability.

The method of the present invention permits the use of a near field microwave probe for detection and quantification of sidewall damage of the patterned sample 24 under study by using established techniques for using near field probes to measure dielectric constant k of blanket films.

Figure 5:
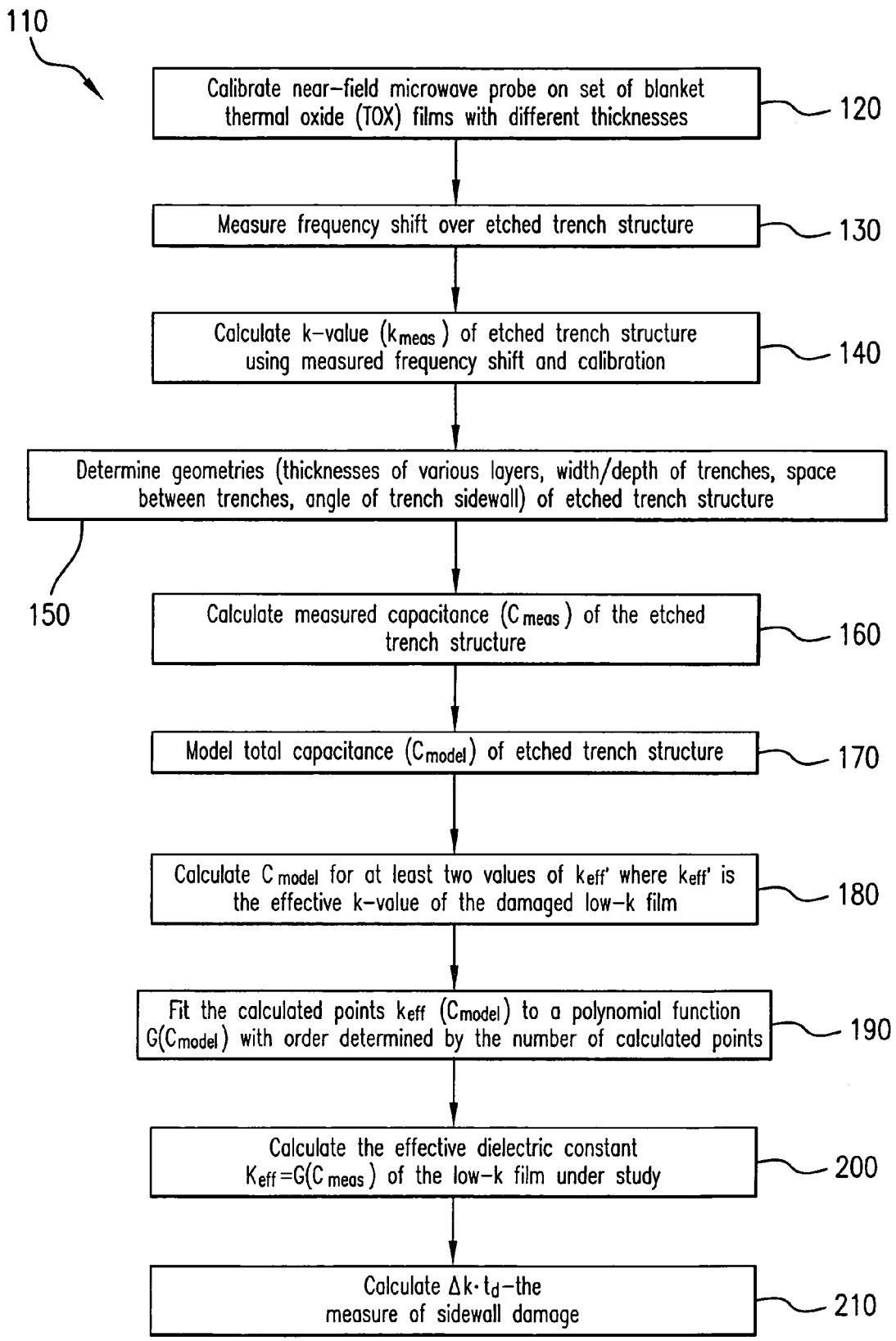
FIG. 5 is a flow chart diagram of the algorithm underlying the operation of the system of the present invention.

As shown in FIG. 5, representing a flow chart diagram of the software 110 of the present invention associated with the processor unit 70, the procedure is initiated in block 120 "Calibrate Near Field Microwave Probe on Set of Blanket Thermal Oxide (TOX) Films with Different Thicknesses". For the purpose of calibration of the near field microwave probe, the system 50 of the present invention is provided with the calibration unit 122 shown in FIG. 3.

One of the most challenging tasks in thin film methodology is to deconvolve the film and substrate contributions. The calibration approach which is used in the box 120, employs a set of variable-thickness thermal oxide (TOX) films 124 with $k_{TOX}$=3.92 on nominally the same substrate as the low-k films of the sample under test with thicknesses ranging around the known low-k film thickness $t_f$. For example, all the low-k samples 24 under study and the TOX calibration films 124 may be fabricated on Si substrates with bulk resistivity ρ<0.01 Ω·cm. Under the condition $\omega C_t \rho / a_t \ll 1$ the material appears as a perfect metal for the probe for ρ~0.01 Ω·cm and 200-nm-thick film with k=4.

The probe calibration is performed in box 120 of FIG. 5 as follows: Two measurements of the frequency shift are made on the bare Si sample with ρ~0.001 Ω·cm (i.e. perfect metal): $\Delta F_{m1} = F_e - F_m[d_0]$ and $\Delta F_{m2} = F_e - F_m[d_0 + t_f]$, where $F_e$ is the probe resonant frequency with no sample, $F_m[d_0]$ is the frequency measured at some tip-sample distance $d_0$ held by the shear-force distance control unit 72, and $F_m[d_0 + t_f]$ is the frequency measured at the distance $d_0 + t_f$. The $\Delta F_{TOX} = F_e - F_{TOX}[d_0]$ is measured for all TOX films 124, where $F_{TOX}[d_0]$ is the probe frequency for the TOX sample at nominally the same $d_0$. The obvious artificial point $\Delta F_{TOX}(t_{TOX}=0) = \Delta F_{m1}$ is added to the $\Delta F_{TOX}$ vs. $t_{TOX}$ data set and the result is fit to the empirical function $A(t) = a + b(1 - \tan h[c(t - t_0)])$, where a, b, c, and $t_0$ are the free parameters. Using this TOX calibration plot, the value $A(t_f)$ is found, and a three-point data set is constructed in order to recover the $\Delta F_f$ vs. $\gamma_f = (k-1)/(k+1)$ dependence at fixed $t = t_f$ including $\{0, \Delta F_{m2}\}$, $\{\gamma_{TOX}, A(t_f)\}$, and $\{1, \Delta F_{m1}\}$. Here γ=0 and $\Delta F_{m2}$ are for an air "film"; and γ=1 and $\Delta F_{m1}$ are for a perfectly conducting "film".

A diagram of $\Delta F_f$ vs. $\gamma_f$ is built which exhibits monotonic dependence (which is generally determined by the tip geometry, tip-sample distance and film thickness) for all $0 \leq \gamma \leq 1$ and can be accurately approximated for 1.5<k<4 by a second order polynomial P(γ). To find the film's $\gamma_f$, the equation $P(\gamma_f)=\Delta F_f$ is solved and finally $k_f=(1+\gamma_f)/(1-\gamma_f)$ is determined, where $\Delta F_f=F_e-F_f[d_0]$ is measured for the low-k film. It is important to note that in this process there is no need to know the absolute value of $d_0$, however, it must be nominally the same for all the measurements, which is provided by the independent shear-force distance control. It turns out that $\Delta F$ has the highest sensitivity to $\gamma$ around k=2, which makes the technique well suited for measurements on low-k materials.

The procedure carried out in block 120, includes the following steps:

Step 1. Adjust the tip-sample distance control unit 72 in a manner that it holds the probe tip 34 at some fixed distance $d_0$ above the sample surface. Typically $d_0$ is in the range from 10 to 200 nm. Generally, the absolute value of this tip-sample separation is unknown. However, it is estimated, by measuring the distance control signal by the distance control mechanism 72 as a function of the tip-to-sample separation by means of the tip approaching the sample in the open feedback loop as described and as shown in FIG. 4. It is preferred to have $d_0$ on the order of or less than $\frac{1}{10}^{th}$ of the tip size $a_t$.

Step 2. Perform calibration of the probe on a metallic-like film with $|k|>>1$, e.g., $\gamma=(k-1)/(k+1)=1$. A bulk calibration sample with very large dielectric constant $|k_m|>>1$ and $\gamma_m=1$ is used. It may be some high-k dielectric (such as TiO2 with k~100), metal (Al, Cu, W, etc.), or low resistivity silicon wafer. The probe frequency shift $\Delta F_m=F_e-F_m$ as a function of the tip-to sample separation d for this sample is measured in the measurements electronics 56, shown in FIGS. 3 and 4. $F_e$ is the empty resonant frequency which is the resonant frequency with no sample present. In practice, this means that the tip-sample separation d is greater than $3a_t$.

Step 3. Perform calibration on air film k=1. A bulk calibration sample with nominally the same dielectric permittivity as the substrate of the film under test may be used for this step. If the film under test is on a metallic or highly conductive substrate, the same calibration sample as in Step 2 may be used. The probe frequency shift $\Delta F_{ea}=F_e-F_a$ is measured as a function of the tip-to-sample separation d for this calibration sample d varying from $d_0$ to $3a_t$.

Step 4. Calibration on $SiO_2$ films with k~4. Additionally, other dielectrics with known dielectric constants may be used. In fact, any film with a well-known dielectric constant that is close to the dielectric constant of the film under study may be used. The calibration materials may include (but are not limited to) $SiO_2$, Teflon, sapphire, MgO, and other materials. As an example, and without limiting the scope of the present invention, the calibration on $SiO_2$ films is described herein. A set of $SiO_2$ films are used with variable thickness ranging around the thickness of the film under test are used. The variable thickness ranges around the thickness of the film under test on nominally the same substrate as the film under test. If the film under test is on a highly conductive or metallic substrate then, preferably, $SiO_2$ should be thermally grown on highly conductive Si, since the k-value of such a thermal oxide (TOX) is well known: $k_{TOX}=3.93\pm0.01$. However, alternatively, $SiO_2$ may be deposited by a CVD process (on a wide variety of substrates). The probe frequency shift $\Delta F_{TOX}$ is measured as a function of the tip-sample separation d for each of these samples for d varying from $d_0$ to $>3a_t$.

A diagram presenting $\Delta F$ vs. d dependence for the calibration samples is built as the result of the steps 2-4.

The flow chart of FIG. 5 from block 120 passes to block 130 "Measure Frequency Shift Over Etched Trench Structure", which is carried out in the following steps:

Step 5. For the sample under study 24 the probe frequency shift $\Delta F_{ef}=F_e-F_f$ is measured vs. the tip-sample separation varying from $d_0$ to $3a_t$.

Step 6. Interpolate all of the above $\Delta F$ vs. d data using some standard interpolation method to construct a calibration curve. It is also possible to fit the data to the functional form such as a $2^{nd}$ or higher order exponential decay. The result of this fit for the metallic calibration sample is the analytical function $F_m(d)$.

From the block 130, the flowchart passes to block 140 "Calculate Dielectric Constant $k_{meas}$ of the Etched Trench Structure Using Measured Frequency Shift and Calibration".

There are several calibration approaches used in the method and system described herein, which are based on either a non-linear calibration curve or on a linear calibration curve.

For the non-linear calibration approach, the probe is calibrated by measuring resonant frequency shift $\Delta F_{ec}=F_e-F_c$ for three "standard" calibration films of nominally the same thickness and on nominally the same substrate as the low-k film under test: $\Delta F_{ea}[t_f]$ for an air film with dielectric constant k=1; $\Delta F_{TOX}[t_f]$ for a thermal oxide film (TOX) with well-known dielectric constant $k_{TOX}=3.92$; and $\Delta F_{Si}$ for a low-resistivity silicon wafer which effectively exhibits infinitely large dielectric constant k>>1 for the probe (Steps 1-6 above). $F_e$ is the probe resonant frequency with no sample, and F is the frequency measured at some distance $d_0$ above the film surface.

In order to create a calibration curve $\Delta F$ vs. $\gamma=(k-1)/(k+1)$ which is generally dependent on the probe geometry and the low-k film thickness, the three calibration data points for frequency shift versus $\gamma$ are plotted and fitted to some functional form such as a $2^{nd}$ order polynomial or other analytical function describing the tip behavior (if known).

In order to determine the dielectric constant $k_{meas}$ of the sample under test, the probe resonant frequency shift $F_{low-k}$ is measured and then converted into the value $k_{meas}$ using the calibration fit function.

For the linear calibration approach, Steps 1-6 are the same as in the non-linear calibration approach. The following steps 7-9 are unique for the linear approach.

Step 7. In order to create a calibration curve $\Delta F$ vs. $\gamma=(k-1)/(k+1)$, which is generally dependent on the probe geometry and the low-k film thickness, the three calibration data points for frequency shift vs. $\gamma$ are plotted. In this scenario, however, these points are plotted not only for the distance $d_0$ above the film surface but also for larger distances. It is noted that for a particular film thickness, the curvature of the frequency shift $\Delta F$ vs. $\gamma=(k-1)/(k+1)$ is a function of this tip-sample distance d. In fact, there is a "critical" distance D* at which $\Delta F$ vs. $\gamma=(k-1)/(k+1)$ is linear. Generally, D* is governed by the tip geometry and depends on the film thickness. D* is independent on k, however typically $D^*\leq t_f$. Using a set of data for a few calibration films with variable thickness from Step 4, D* vs. film thickness is determined. This dependence is close to linear and from it D* may be found for any film thickness.

Specifically, in the Step 7, in order to determine the distance D*, the probe resonant frequency shift $\Delta F_{ec}$ vs. tip-sample separation is measured for a plurality of calibration films 124 of different thicknesses, a tip-sample separation $D^*_c$ at which said calibration curve measured for said plurality of calibration films behaves linearly is determined, further the dependence between the $D^*_c$ and the thickness of each of said calibration films is determined; and tip-sample separation $D^*_s$ corresponding to the thickness of the sample under study is obtained, based on the dependence between the $D^*_c$ and the thickness of the calibration films.

The calibration films are the films with a well-known dielectric constant that ranges around the dielectric constant of the film under study. The calibration material may include $SiO_2$, thermal oxide, Teflon, sapphire, MgO, and others.

Step 8. $D^*$ for the film thickness $t_f$ of the sample under study is determined and the probe resonance frequency shift $\Delta F_{ef}$ of the sample under study is measured at the tip-sample separation $D^*_s$.

Step 9. The calibration curve $\Delta F$ vs. $(k-1)/(k+1)$ at $D^*$ for the film thickness $t_f$ is linear and is created from $\Delta F$ measurements on the air and metallic calibration films.

The data corresponding to the probe resonance frequency shift $\Delta F_{ef}$ of the sample under study measured at the tip-sample separation $D^*_s$ are fitted into the linear calibration curve to obtain the dielectric constant $k_{meas}$ of the sample under study.

It is readily apparent to those skilled in the art that the linear calibration curve $\Delta F_{ec}$ vs. $\gamma=(k-1)/(k+1)$ is based on the calibration data points acquired as the result of calibration of the near-field microwave probe at the tip-sample separation $D^*_c$ for each calibration sample of the steps 2-4.

From block 140, the flow chart passes to block 150 "Determine Geometries of Etched Trench Structure". In order to determine geometries of the sample under study such as thicknesses of various layers, widths/depths of trenches, space between trenches, angle of trench sidewall, etc., the system of the present invention includes a geometries block 126, shown in FIG. 3, which may be implemented in several fashions depending on what technique is used to acquire the geometric information of the etched trench structure.

The geometry of the sample under study may be determined based on one or several of various methods, such as nominal geometry based on photomask layout, or be measured by optical methods, commonly known as OCD of scatterometry, or by cross-sectional scanning electron microscope, e.g., X-section SEM, or alternatively, by the technique known as CD-SEM, or "top-down" SEM, which also uses scanning electron microscope images as in the X-section SEM, however, the images are taken from the top of the structure rather than in cross-section. The geometry parameters of the sample under study, which are referred to in the semiconductor industry as "critical dimensions", are supplied from the geometries unit 126 to the data processor 70 to be further used in calculations.

From block 150, the flow chart of FIG. 5 follows to block 160 "Calculate Measured Capacitance ($C_{meas}$) of the Etched Trench Structure". In this step, the data processor 70 calculates the capacitance of the capacitor 40 shown in FIGS. 2B-2E in accordance with the Eq. (6):

$$C_{meas} = \frac{k_{meas} \cdot (S + W)}{t_{film}}$$

As can be seen, the data processor 70 uses $k_{meas}$ calculated in block 140 and the critical dimensions of the sample 24 under study determined in block 150.

After calculation of the capacitance $C_{meas}$ in block 160, the flow chart diagram follows to block 170 "Model Total Capacitance $C_{model}$ of Etched Trench Structure". For this step, the system of the present invention includes a model unit 128, shown in FIG. 3, which performs modeling of the total capacitance of the etched trench structure using various modeling methods, such as for example, an analytical model based on lumped element capacitors, or a numerical finite element model, e.g., Maxwell™ technique, or a numerical finite difference model, e.g., Raphael™ technique. The modeling unit 128 uses dielectric constants and geometries of the sample under study as input parameters for modeling.

Figure 6:
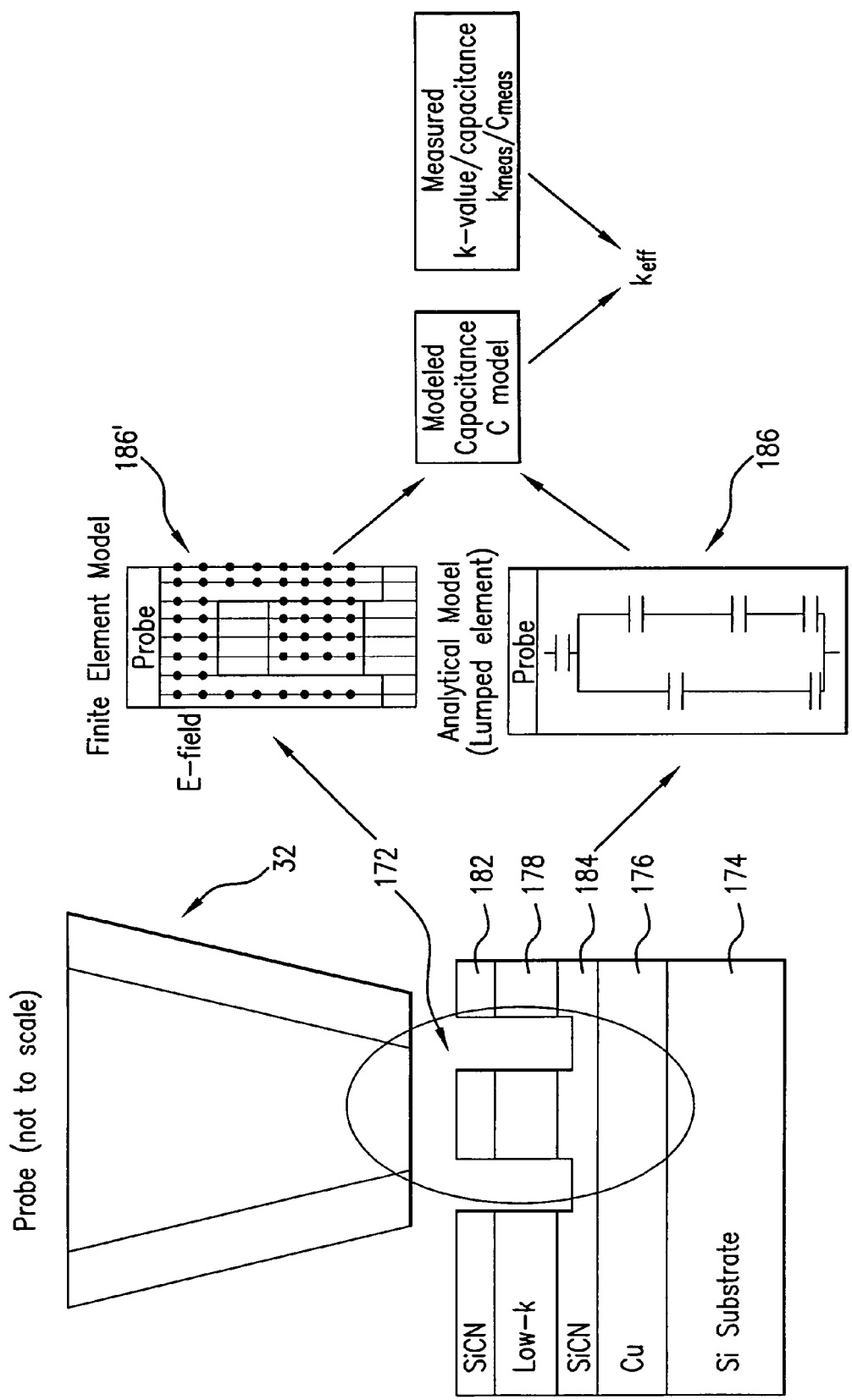
FIG. 6 is a schematic representation of modeling/analysis approach underlying blocks 170-200 of the algorithm presented in FIG. 5.

The sample under study 24 is a periodic array of etched trenches. The modeling unit 128 can construct two- or three-dimensional models for one or more periods of the periodic array. This is determined by practicality and time affordability of the calculation process. By way of example only, and not to limit the scope of protection intended for the subject invention, as shown in FIG. 6, a 2-dimensional model of a single period structure 172 of the sample 24 under study is constructed. For the models, each parameter, e.g., all dimensions and the dielectric constants for the analyzed structure k, must be defined. As can be seen in FIG. 6, the single period structure 172 is a multi-layered arrangement which may include any variety of layers. As an example only, and not for limiting the scope of protection intended for the subject invention, the structure 172 is described which includes the Si substrate 174, Cu layer 176 on the substrate 174, and the low-k layer 178 sandwiched between two thin SiCN (nitrogen-doped silicon carbide) layers 182 and 184. If the measured structure consisted only of a single low-k layer 178 on the substrate 174, then the effective $k_{eff}$ of the structure 172 would correspond to k value of the low-k layer needed for further calculations. However, the other layers also contribute in the total k-value of the structure 172. The materials of these layers are generally more well-characterized than the low-k material, and therefore, the dielectric constants of these layers can be defined as "known" for the modeling unit 128. In the example shown in FIG. 6, the k value of the SiCN layers 182, 184 is 4.5. This k value is fixed for modeling purposes. This approach is applicable for analysis of multi-layered structures with any number of stacked dielectric layers, as long as all, but the low-k, materials are well characterized, i.e., have well-known dielectric constants.

Based on the geometries of the structure 172 defined by the Geometries Unit 126, the model is constructed in the block 170. The model can be an analytical lumped-element capacitor model 186, wherein each segment of the structure 172 is treated as a parallel plate capacitor, or a numerical model 186' (e.g., Maxwell™ or Raphael™). The output of these models 186 and/or 186' is the capacitance $C_{model}$ across the structure 172, which is calculated in block 170.

Figure 7:
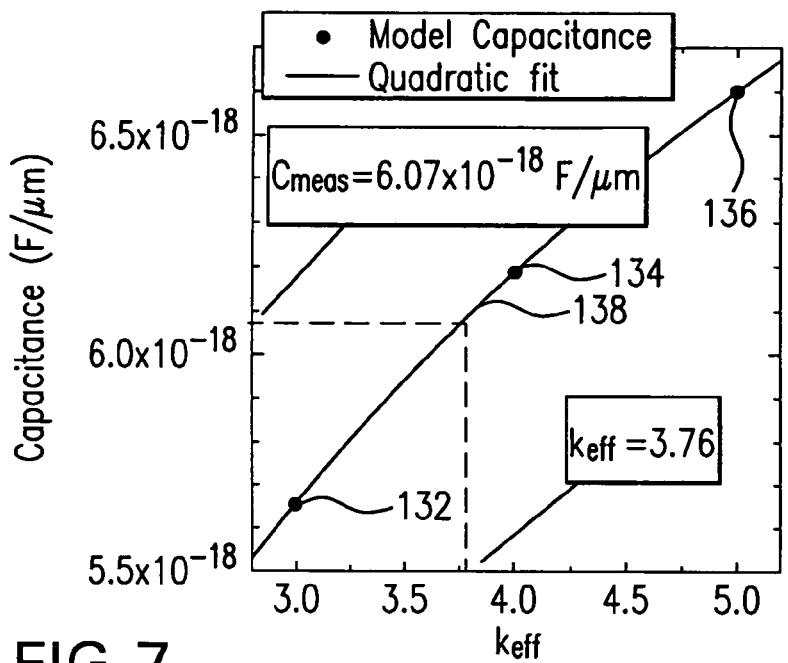
FIG. 7 is a diagram showing a procedure for determination of effective dielectric constant $k_{eff}$.

After the modeling unit 128 has constructed a model capacitance $C_{model}$, the flow chart shown in FIG. 5 passes to block 180 "Calculate $C_{model}$ for at Least Two Values of $k_{eff}$". The processor 70 uses the dielectric constant $k_{eff}$ which is the effective k value of the damaged low-k film of the sample under study. The values of the $k_{eff}$ are chosen to be in the range of values, ideally both above and below, the expected $k_{eff}$ for the film of the sample under study. Basically, the value of $k_{eff}$ could be continually varied in the model built in block 170 until $C_{model}=C_{meas}$. This approach works for the analytical lumped element model, however, it would be extremely time consuming for the numerical models. Therefore, instead of this continually varying $k_{eff}$ approach, the algorithm of the present invention evaluates the model $C_{model}$ for a limited number of $k_{eff}$ values and then interpolates between these $k_{eff}$ values using the polynomial function defined as polynomial function G. As best shown in FIG. 7, the model capacitance $C_{model}$ is evaluated for $k_{eff}=3.0, 4.0$, and 5.0 presented as solid black circles 132, 134, and 136. These values of $k_{eff}$ are fit to a polynomial function G ($C_{model}$) in block 190 of the flow chart shown in FIG. 5. This polynomial function G has an order determined by the number of calculated points and is linear for two calculated points, quadratic for three points, etc. The polynomial function 138 shown on the diagram of FIG. 7 is a second order polynomial function for three calculated points of the $k_{eff}$.

From the block 190, the flow chart flows to block 200 "Calculate $k_{eff}$=G($C_{meas}$)". In this step, the processor unit 70 determines the effective dielectric constant $k_{eff}$ of the low-k film of the sample under study where the modeled capacitance $C_{model}$ and the measured capacitance $C_{meas}$ coincide as presented in FIG. 6, and as shown in FIG. 7, where the polynomial function 138 serves to determine $k_{eff}$.

The step performed in the block 200 for extracting of $k_{eff}$ is an intermediate step to determining the measure of the sidewall damage $\Delta k \cdot t_d$. In some cases, $k_{eff}$ might be the information that a user needs as $k_{eff}$ is the effective dielectric constant of the dielectric material that remains between the etched trenches of the sample under study. However, this material may not be uniform and the damage to this material, i.e., change in dielectric constant, which is generally isolated to a region of the thickness $t_d$ along the sidewall of the trench, may be needed for analysis. The $k_{eff}$ is essentially the combination of the undamaged material in the center of the material remaining between the trenches far from the sidewalls and two layers of damaged materials on each sidewall, as shown in FIG. 1C.

Further, the flow chart diagram flows to block 210 "Calculate $\Delta k \cdot t_d$—the Measure of Sidewall Damage". In the case shown in FIG. 1C, illustrating a single-layer structure, the measure of sidewall damage may be calculated based on Eq. 7, presented supra herein. However, in the case of the multi-layered structure 172, shown in FIG. 6, sidewall damage $\Delta k \cdot t_d$ cannot be determined from $k_{meas}$. Instead, in block 210, the processor unit 70 calculates the measure of the sidewall damage $\Delta k \cdot t_d$ in accordance with the following Equation:

$$\Delta k \cdot t_d = \frac{S}{2}(k_{eff} - k) \quad (10)$$

wherein $k_{eff}$ is the dielectric constant obtained in block 200, k is the dielectric constant of the undamaged low-k film of the sample under study, and S is a spacing between the trenches.

Figure 8:
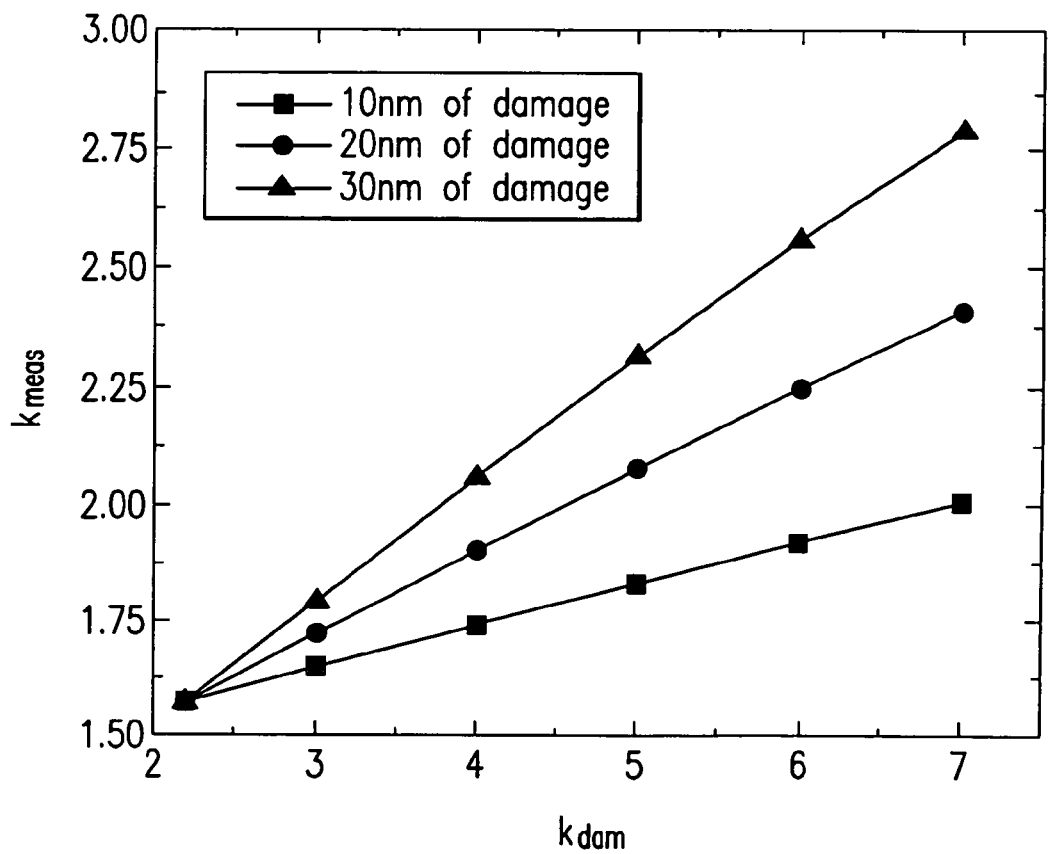
FIG. 8 is a diagram representing relationship of $k_{meas}$ to dielectric constant $k_{dam}$, and thickness $t_d$ of the damaged sidewall.

As described above, by using the measurement technique for blanket films, the near field microwave probes were shown to have sensitivity to sidewall damage of the patterned structure prior to metallization. Models have been constructed for several typical samples under study and the sensitivity to damaged k value $k_d$ and thickness $t_d$ was found as presented in FIG. 8 where the established precision of <0.5% in $k_{meas}$ gives excellent sensitivity to $k_d$ and thickness $t_d$=10 nm, 20 nm, and 30 nm.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A method of measurement of sidewall damage in a sample under study, comprising the steps of:
   (a) positioning the tip of a near-field microwave probe (NMP) a predetermined tip-sample separation distance over the surface of said sample under study, said sample under study including a plurality of trenches etched in a low-k film, said trenches having sidewalls;
   (b) measuring the dielectric constant $k_{meas}$ of said sample under study by said NMP;
   (c) determining geometries of said sample under study;
   (d) calculating a capacitance $C_{meas}$ of said sample under study based on said dielectric constant $k_{meas}$ and said geometries of said sample under study;
   (e) modeling a total capacitance $C_{model}$ of said sample under study in accordance with a predetermined modeling algorithm;
   (f) finding a dielectric constant $k_{eff}$ at which said $C_{model}$ substantially equals said $C_{meas}$, wherein said $k_{eff}$ is the effective dielectric constant of said sample under study; and
   (g) extracting a measure of the sidewall damage using said $k_{eff}$ $$\Delta k \cdot t_d = \left(\frac{S}{2}\right)(k_{eff} - k),$$

wherein $\Delta k \cdot t_d$ is the measure of sidewall damage,
$t_d$ is the thickness of the sidewall damage;
$\Delta k$ is the change of the dielectric constant due to the sidewall damage,
k is the dielectric constant of the undamaged said low-k film,
$k_{eff}$ is the effective dielectric constant of the low-k material remaining between the trenches after etch, and
S is the spacing between trenches etched in said low-k film.

2. The method of claim 1, further comprising the steps of:
in said step (d), calculating the capacitance $C_{meas}$ as $$C_{meas} = \frac{k_{meas}(S + W)}{t_{film}},$$

wherein S is the spacing between the trenches,
W is a width of each of said plurality of the trenches,
$t_{film}$ is the thickness of said low-k film, and
$k_{meas}$ is the dielectric constant measured in said step (b).

3. The method of claim 1, further comprising the steps of:
choosing a predetermined number of $k_{eff}$ values from a range of $k_{eff}$ values expected for said sample under study,
fitting the values of the $C_{model}$ for said plurality of $k_{eff}$ values to a polynomial function G ($C_{model}$), and extracting said $k_{eff}$ in said step (f) therefrom.

4. The method of claim 3, wherein said polynomial function G ($C_{model}$) is the function of the order determined by said predetermined number of the $k_{eff}$ values.

5. The method of claim 1, wherein in said step (b), said dielectric constant $k_{meas}$ is measured by a measuring technique applicable to a blanket dielectric low-k film.

6. The method of claim 5, wherein said NMP forms a resonator structure, and wherein said measuring technique further comprises the steps of:
measuring probe resonant frequency shift $\Delta F_{ef} = F_e - F_f$ vs. said tip-sample separation, wherein $F_e$ is the probe resonance frequency of an empty resonator structure, and $F_f$ is the probe resonance frequency measured at said predetermined tip-sample separation distance,
calibrating said NPM on a set of blanket films having different thicknesses; and calculating said $k_{meas}$ of said sample under study using the measured frequency shifts $\Delta F_{ef}$.

7. The method of claim 6, further comprising the steps of:
calibrating said NMP for a plurality of calibration blanket films, each said calibration blanket film having a respective dielectric constant $k_c$, by measuring probe resonant frequency shift $\Delta F_{ec} = F_e - F_c$ vs. a distance between said probe tip and said each of said plurality of calibration blanket films, wherein $F_c$ is the probe resonant frequency measured at said distance between said probe tip and said each calibration blanket film held substantially equal to said predetermined tip-sample separation;
constructing a calibration curve based on calibration data acquired as the result of the calibrating of said near-field microwave probe for said plurality of calibration blanket films;
fitting said probe resonant frequency shift $\Delta F_{ef}$ of said sample under study into said calibration curve; and
extracting said dielectric constant $k_{meas}$ of said sample under study therefrom.

8. The method of claim 7, wherein said plurality of calibration blanket films includes a set of blanket films of a variable thickness ranging around the thickness $t_{film}$ of said low-k film of said sample under study, said films having a dielectric constant ranging around the dielectric constant $k_{eff}$ of said sample under study.

9. The method of claim 1, further comprising the steps of:
determining the geometries of said sample under study by a method selected from the group of methods consisting of analysis of a photomask layout, optical measurements, and measurements by scanning electron microscope.

10. The method of claim 1, further comprising the steps of:
constructing a model of the total capacitance $C_{model}$ in accordance with a modeling technique selected from a group consisting of analytical modeling based on lumped-element capacitors model, numerical finite-element model, and numerical finite difference model.

11. The method of claim 10, further comprising the steps of:
constructing said model in two-dimensional or three-dimensional domain.

12. A system for measurements of sidewall damage in a sample under study, comprising:
a sample, said sample including a plurality of trenches etched in a low-k film of a thickness $t_{film}$ formed on a substrate, each of said plurality of trenches having sidewalls;
a near-field microwave probe having a tip, said near-field microwave probe forming a resonator structure;
a measurement unit measuring resonance frequency shift of said near-field microwave probe for said sample;
a geometries unit determining geometries parameters of said sample;
a model unit modeling a total capacitance $C_{model}$ of said sample; and
a processor unit coupled to said measurement unit, said geometries unit, and said model unit to calculate in sequence:
(a) dielectric constant $k_{meas}$ of said sample using the measured resonance frequency shift obtained from said measurement unit;
(b) measured capacitance $C_{meas}$ of said sample using said dielectric constant $k_{meas}$ and the geometries parameters of said sample obtained from said geometries unit,
(c) dielectric constant $k_{eff}$ at which said total capacitance $C_{model}$ equals to said measured capacitance $C_{meas}$, and
(d) a measure of the sidewall damage using said dielectric constant $k_{eff}$ and said geometries parameters.

13. The system of claim 12, wherein said measure of the sidewall damage is calculated as:

$$\Delta k \cdot t_d = \frac{S}{2}(k_{eff} - k),$$

wherein $\Delta k$ is a change of the dielectric constant k of the undamaged low-k film due to the sidewall damage,
$t_d$ is the thickness of the sidewall damage,
$k_{eff}$ is the effective dielectric constant of the low-k material remaining between the trenches after etch,
k is the dielectric constant of the undamaged low-k film, and
S is the spacing between the trenches.

14. The system of claim 12, wherein said processor unit calculates said $C_{meas}$ as:

$$C_{meas} = \frac{k_{meas}(S+W)}{t_{film}}$$

wherein S is the spacing between the trenches,
W is a width of each of said plurality of trenches, and
$t_{film}$ is the thickness of said low-k film.

15. The system of claim 12, wherein said processor unit chooses a predetermined number of $k_{eff}$ values from a range of $k_{eff}$ values expected for the damaged said low-k film of said sample, and
fits the values of the $C_{model}$ for said plurality of $k_{eff}$ values to a polynomial function G ($C_{model}$) to extract said $k_{eff}$ therefrom.

16. The system of claim 12, further comprising:
a distance control unit operatively coupled to said near-field microwave probe to control tip-sample separation.

17. The system of claim 16, further comprising:
a plurality of calibration films, and
a calibration unit, said calibration unit constructing a calibration curve based on calibration data points acquired as the result of the calibration of said near-field microwave probe for said plurality of calibration films vs. tip-sample separation,
wherein said processor unit fits said resonance frequency shift measured vs. tip-sample separation for said sample into said calibration curve to extract said dielectric constant $k_{meas}$ of said sample therefrom.

18. The system of claim 17, wherein said plurality of calibration films includes a set of blanket films of a variable thickness ranging around the thickness $t_{film}$ of said low-k film of said sample, said calibration films having a dielectric constant ranging around the dielectric constant $k_{eff}$ of said sample.

19. The system of claim 16, wherein said distance control unit includes a shear force distance control mechanism.

20. The system of claim 12, wherein said model unit includes a model algorithm selected from a group consisting of analytical model based on lumped element capacitors, numerical finite-element model, and numerical finite difference model.

* * * * *